United States Patent
Rajsuman

[19]

[11] Patent Number: 5,867,036
[45] Date of Patent: Feb. 2, 1999

[54] DOMINO SCAN ARCHITECTURE AND DOMINO SCAN FLIP-FLOP FOR THE TESTING OF DOMINO AND HYBRID CMOS CIRCUITS

[75] Inventor: Rochit Rajsuman, San Jose, Calif.

[73] Assignee: LSI Logic Corporation, Milpitas, Calif.

[21] Appl. No.: 655,438

[22] Filed: May 29, 1996

[51] Int. Cl.[6] .......................... H03K 19/96; H03K 19/00; G01R 31/28

[52] U.S. Cl. ................................ 326/16; 326/93; 326/98; 371/22.1

[58] Field of Search .................. 326/16, 93, 95, 326/98; 371/22.1

[56] References Cited

U.S. PATENT DOCUMENTS

| | | | |
|---|---|---|---|
| 4,864,579 | 9/1989 | Kishida | 371/22.31 |
| 5,450,415 | 9/1995 | Kamada | 371/22.1 |
| 5,491,699 | 2/1996 | Scheuermann et al. | 371/22.1 |
| 5,513,187 | 4/1996 | Zepp | 371/22.32 |

OTHER PUBLICATIONS

R. H. Krambeck, C. M. Lee and H. Law, "High–Speed Compact Circuits with CMOS", IEEE J. Solid–State Circuits, vol. SC–17, pp. 614–619, Jun. 1982.

J. A. Pretorius, A. S. Shubat and C. A. T. Salama, "Analysis and Design Optimization of Domino CMOS Logic with Application to Standard Cells", IEEE J. Solid–State Circuits, vol. SC–20, No. 2, pp. 523–530, Apr. 1985.

N. F. Goncalves and H. J. De Man, "NORA: A Racefree Dynamic CMOS Technique for Pipelined Logic Structures", IEEE J. Solid–State Circuits, vol. SC–18, No. 3, pp. 261–266, Jun. 1983.

C. M. Lee and E. W. Szeto, "Zipper CMOS", IEEE Circuits and Devices Magazine, pp. 10–16, May 1986.

J. A. Pretorius, A. S. Shubat and C. A. T. Salama, "Latched Domino CMOS Logic", IEEE J. Solid–State Ciruits, vol. SC–21, No. 4, pp. 514–522, Aug. 1986.

K. M. Chu and D. L. Pulfrey, "A Comparison of CMOS Circuit Techniques: Differential Cascode Voltage Switch Logic Versus Conventional Logic", IEEE J. Solid–State Circuits, vol. SC–22, No. 4, pp. 528–532, Aug. 1987.

T. A. Grotjohn and B. Hoefflinger, "Sample–Set Differential Logic (SSDL) for Complex High–Speed VLSI", IEEE J. Solid–State Circuits, vol. SC–21, No. 2, pp. 367–369, Apr. 1986.

V. G. Oklobdzija and P. G. Kovijanic, "On Testability of CMOS–Domino Logic", Proc. FTCS, pp. 50–55, 1984.

(List continued on next page.)

*Primary Examiner*—Jon Santamauro

[57] ABSTRACT

Hybrid CMOS circuit configurations that include both static CMOS logic and Domino CMOS logic include two registers that surround the Domino logic to allow that logic to be tested. One register receives an input test vector, loaded directly through a primary set of inputs or by a serial scan chain if the register inputs are not directly accessible. The second register latches the results of the test vector application. The register contents can either be read directly through a primary set of outputs if there is no static CMOS logic between the register outputs and a primary set of circuit outputs, or scanned out of the second register using a serial scan chain. Domino scan flip-flops, which reduce transistor count over conventional static scan flip-flops, can be used in the Domino logic as sequential elements to implement multiple logic functions. These scan flip-flops can be serially connected as part of a separate scan chain or integrated into a single scan chain with the registers and any other static scan flip-flops in the circuit. Domino scan flip-flops allow all of the nominal logic to be tested in conjunction with the two registers. A Domino clock used to drive the Domino logic and a system clock used to drive the static CMOS logic ensures that correct test data is applied and read out from the hybrid circuit.

24 Claims, 4 Drawing Sheets

OTHER PUBLICATIONS

N. K. Jha, "Testing for Multiple Faults in Domino–CMOS Logic Circuits", IEEE Trans. CAD, vol. 7, No. 1, pp. 109–116, Jan. 1988.

N. Ling and M. Bayoumi, "An Efficient Technique to Improve NORA CMOS Testing", IEEE Trans. on Circuits and Systems, vol. CAS–34, No. 12, pp. 1609–1611, Dec. 1987.

N. Jha and Q. Tong, "Testing of Multiple–Output Domino Logic (MODL) CMOS Circuits", IEEE J. of Solid–State Circuits, vol. 25, No. 3, pp. 800–805, Jun. 1990.

E. McCluskey, "Logic Design Principles with Emphasis on Testable Semicustom Circuits", Prentice–Hall, pp. 433–447, 1986.

R. Rajsuman, "Digital Hardware Testing: Transistor–Level Fault Modeling and Testing", Artech House, Inc., pp. 38–42 and 67–68, 1992.

K. M. Chu and D. Pulfrey, "Design Procedures for Differential Cascode Voltage Switch Circuits", IEEE J. of Solid–State Circuits, vol. SC–21, No. 6, pp. 1082–1087, Dec. 1986.

DOMINO SCAN ARCHITECTURE AND DOMINO SCAN FLIP-FLOP FOR THE TESTING OF DOMINO AND HYBRID CMOS CIRCUITS

BACKGROUND OF THE INVENTION

This invention relates generally to logic circuits and more particularly to testable logic circuits.

Modern digital electronics continue to become more and more complex. This increased complexity places greater and greater demands on the underlying semiconductor technology to allow these designs to be integrated into a single integrated circuit. The advantages of integrated circuits are well known: faster speeds, lower manufacturing costs and higher reliability.

One approach to improving the speed and reducing the transistor count, and hence the die size in existing designs, is to use dynamic logic in place of static logic. There are several dynamic logic families: Domino CMOS and differential cascode voltage swing logic (DCVS) and their derivatives, which include no race logic (NORA), N-P Domino or Zipper CMOS, latch Domino, cascode voltage switch logic (CVSL), sample set differential logic (SSDL), and clocked CMOS logic. The DCVS logic implements both true and complementary functions using nMOS transistors. As a result, the transistor count in DCVS logic is generally high and therefore significant area savings over static CMOS is generally not achieved. Domino CMOS logic, on the other hand, uses a pseudo nMOS structure that does yield a significant reduction in transistor count over static CMOS. In addition, Domino logic has a smaller pull-up delay and negligible short-circuit current resulting from the dynamic operation. Therefore, Domino CMOS logic appears to be a potentially viable logic family for the levels of integration forecasted for future generations of ICs.

The main difficulty in adopting the Domino logic family is testing. Several references have discussed testing Domino CMOS logic. See, e.g., R. Rajsuman, "Digital Hardware Testing", pp. 38–42, 1992; V. G. Oklobdzija and P. G. Kovijanic, "On Testability of CMOS-Domino Logic", Proc. FTCS, pp. 50–55, 1984; and N. K. Jha, "Testing for Multiple Faults in Domino-CMOS Logic Circuits", IEEE Trans. CAD, Vol. 7, pp. 109–116, Jan. 1988. All of these references, however, make the operating assumption that the Domino CMOS logic circuit is comprised of purely combinational Domino gates. Sequential Domino logic was considered too complex and as a result has not been addressed. In reality, this assumption is not valid because pure combinational Domino logic has very limited use. Currently, as well as for the foreseeable future, most designs are done in static CMOS logic. There are several reasons for this. First, most CAD design tools do not support Domino logic and, therefore, any synthesis tools generate only static logic designs. Second, most circuit designers do not work from scratch. They take existing designs, which are almost exclusively in static CMOS, and integrate those into a new design so as to leverage the design and testing work that was done on those existing blocks. If Domino CMOS logic is to be used, at least for the foreseeable future, it will be in combination with static CMOS logic. The problem is that there is no existing technique to test these "hybrid" circuits that include both static CMOS and dynamic Domino CMOS logic.

The difficulty of testing Domino CMOS gates is apparent upon examining the general structure of a Domino CMOS gate. Such a gate is shown generally at 10 in FIG. 1A. The generic logic gate 10 includes an nMOS block 12, which implements the logic function, a pMOS transistor 14, an nMOS transistor 16, and a load inverter 18. A clock signal is applied to the gates of transistors 14 and 16 at input terminal 20 and one or more input signals are provided to the nMOS block 12 on inputs 22. An output signal is provided on an output 24 coupled to the output terminal of the load inverter 18. An alternative embodiment of gate 10 is shown in FIG. 1B, which includes an additional pMOS transistor 26 to maintain the voltage level at intermediate node W at the input of the load inverter 18. The gate of pMOS transistor 26 can either be coupled to ground thereby turning the transistor permanently on or, alternatively, connected to the output node 24 so that the transistor 26 is only turned on when the output is 0.

The operation of Domino CMOS logic takes place in two distinct phases: a precharge phase and an evaluation phase. The precharge phase occurs when the clock signal is 0. In this phase, transistor 14 is turned on and transistor 16 is turned off. In both structures of FIG. 1, the node W is precharged to 1 during the precharge phase. Thus, when the clock signal is 0, the output of gate 10 is also 0 because of the inversion. The structure of FIG. 1B has a faster precharge time due to the parallel paths through which node W is precharged. This faster precharge time, however, comes at the cost of higher power dissipation during the evaluation phase, discussed next.

During the evaluation phase, the clock signal is at a logic 1 and the node W is conditionally discharged based upon the input signals and the logic function implemented by nMOS block 12. If node W becomes 0 during the evaluation phase, then the gate output becomes 1, otherwise remains at 0. This effect of switching from 0-to-1 is propagated serially as a Domino behavior, hence the name, when multiple Domino CMOS gates are cascaded to implement a logic function.

It should be noted that during the evaluation phase, the short circuit current is negligible in the structure of FIG. 1A, while the structure of FIG. 1B will dissipate current during the evaluation phase. To avoid this short-circuit current, sometimes the gate node of parallel pMOS 26 is connected to the output node as indicated by the dotted line. The problem with this is that it slows down the evaluation phase due to the increase loading at the output 24 of gate 10.

The unique behavior of the Domino logic gate significantly affects the ability to test the logic gate. The fact that the gate output is always 0 during precharge phase (clock 0) restricts the application of a test vector to the circuit. In a gate level model of the circuit, all of the nodes will be initialized to 0 during the precharge phase. Thus, conventional test vectors developed for static CMOS logic are not applicable. This affects both functional and scan testing of the Domino logic.

The fact that the gate output switch is unidirectionally (0-to-1) during evaluation phase also restricts the fault sensitization and fault-effect propagation. As a 0-to-1 transition is not obtained during the evaluation phase, maximum toggle coverage can only be 50%. It is worth noting that 1-to-0 transition is mandatory during precharge for all of the output nodes which are at logic 1 during evaluation phase. The effect of the transition, however, is not propagated due to initialization during precharge. Again, both functional and scan testing are affected.

Another attribute of Domino logic that impacts the testing of Domino logic circuits is the fact that the output is noninverting. This restricts the computation of test vectors as well as test application during both functional and scan testing. The dynamic behavior itself also imposes constraints on testing. Because in most realistic designs the Domino logic will be used in combination with static CMOS logic, which may be synchronized to a different clock, existing testing techniques are not applicable.

Accordingly, a need remains for the ability to test hybrid circuits built using Domino and static CMOS circuits.

SUMMARY OF THE INVENTION

It is an object of the invention to provide a test methodology for testing hybrid circuits built using Domino and static CMOS logic circuits.

Another object of the invention is to provide a methodology that works in conjunction with existing testability techniques.

A circuit architecture is described that permits testing the Domino as well as hybrid Domino and static logic circuits. This architecture, in its most simplest form, includes two registers, one at the input of the circuit and one at the output, that surround a Domino logic block to allow the circuit to be tested. The input register is interposed between a primary set of inputs on which the test data is applied and the Domino logic. The test data, i.e., test vector, is stored into this register to hold the input values at a known state during both the precharge and evaluation phases of the Domino logic circuit. The second register is coupled to the Domino logic to store the results of the evaluation phase. These two registers are clocked by a system clock that is separate from the Domino clock to ensure that the input data is applied to the Domino logic at the appropriate time and that the data is latched into the output register is at the correct level based on the Domino logic.

In another aspect of the invention, a Domino scan flip-flop is disclosed which allows for scan testing of Domino logic that includes sequential elements. The Domino scan flip-flops can then be connected into a serial chain to allow input test data to be scanned into the Domino logic and the resulting output test data scanned out of the Domino logic. The Domino scan flip-flops can either be a separate scan chain in the overall circuit or included as part of a single scan chain including the two registers and any other static scan flip-flops in the design.

This architecture allows any hybrid circuit to be tested. In one embodiment, static CMOS logic is included between the primary inputs and the input register. This static CMOS logic can either be purely combinational or a combination of sequential as well as combinatorial logic. If the former, the sequential elements can be implemented using static scan flip-flops, which can be integrated into the scan chain of the circuit.

In another embodiment of the architecture, static CMOS logic can be included downstream of the output register between the output register and the primary outputs. As with the input static CMOS logic, the output static CMOS logic can be either/or combinational or sequential static logic. If sequential logic, the sequential elements can be formed using static scan flip-flops, which can be integrated into an exclusive static scan chain or in combination with the Domino logic scan chain should the Domino logic include sequential elements.

The foregoing and other objects, features and advantages of the invention will become more readily apparent from the following detailed description of a preferred embodiment of the invention which proceeds with reference to the accompanying drawings.

DETAILED DESCRIPTION

Figure 2:
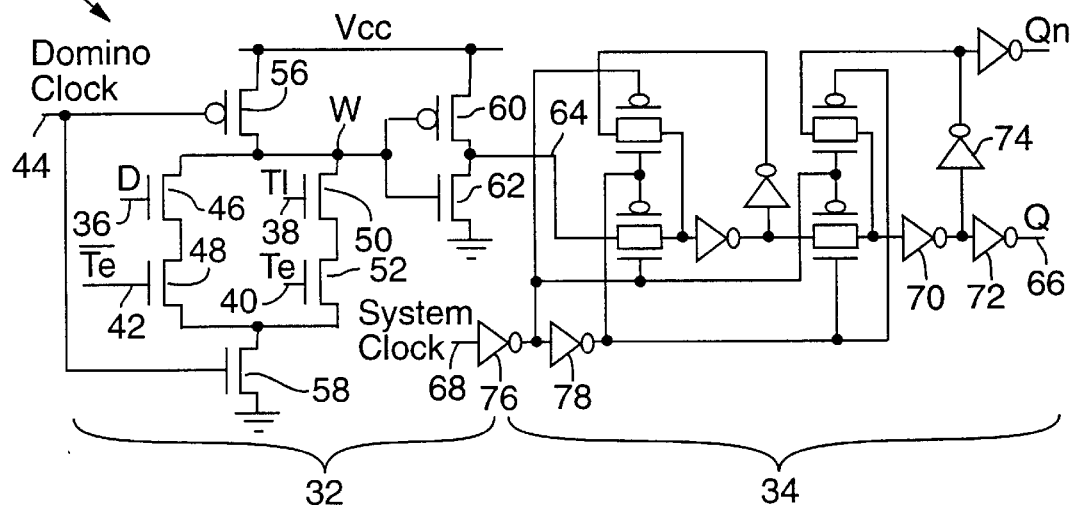
FIG. 2 is a schematic diagram of a Domino scan flip-flop according to the invention.

Referring now to FIG. 2, a schematic diagram of a D-type Domino scan flip-flop is shown generally at 30. A D-type Domino scan flip-flop is shown by way of illustration and not by way of limitation. Other types of Domino scan flip-flops such as J-K, T and others, can be implemented using the principles and techniques described hereinafter. The Domino scan flip-flop, regardless of its actual logical operation, need only include the following:

1. a mechanism to operate in one of two modes of operation:
   (a) as an ordinary flip-flop during the normal mode of operation; and
   (b) as part of a shift register during the test mode;
2. an additional input through which test input data is fed;
3. a capability to select one of the two inputs:
   (a) normal data; and
   (b) test-input data; and
4. the operation should be clock controlled such that the input to a latch part of the flip-flop should also be "0" during precharge phase. Thus, the flip-flop output should not change during the precharge phase.

As long as these criteria are satisfied, any logical flip-flop can be constructed using Domino logic.

The D-type Domino scan flip-flop 30 includes two basic components: a Domino multiplexer 32 and a latch 34. The multiplexer 32 includes five inputs: a data input 36 for receiving normal data (D) during a normal mode of operation; a test data input 38 to which test input data is applied during a test mode; a first test enable input 42 for receiving a test enable signal of a first polarity; a second test enable input 40 for receiving a second test enable signal (Te) of a second polarity, in general the second polarity being opposite of the first polarity; and a Domino clock input 44 for receiving a Domino clock. This number of inputs could be reduced by one by having only a single test enable input and generating the opposite polarity with an inverter. That approach, however, requires an additional inverter for each gate whereas the design shown in FIG. 2 can use a single inverter to generate the opposite polarity test enable signal for all of the Domino logic gates in the circuit.

Figure 1A:
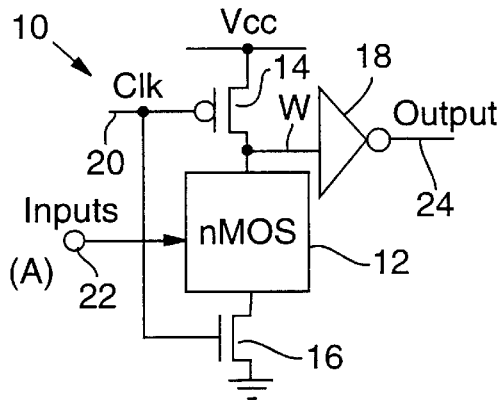
FIG. 1A is a schematic diagram of a prior art Domino logic gate.
Figure 1B:
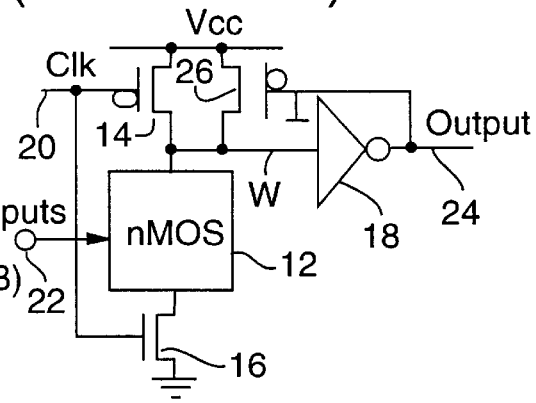
FIG. 1B is a schematic diagram of another embodiment of the Domino logic gate FIG. 1A.

The multiplexer 32 further includes eight transistors; six nMOS and two pMOS. The four nMOS transistors 46, 48 50 and 52 correspond to the nMOS block 12 shown in FIGS. 1A and 1B while pMOS transistor 56 corresponds to pMOS transistor 14 and nMOS transistor 58 corresponds to nMOS transistor 16 also of FIGS. 1A–1B. The inverter 18 is implemented by transistor 60 and 62 configured in the known way. Transistors 46 and 48 are connected in series between transistors 56 and 58 as are transistors 50 and 52 thereby forming two parallel branches. The four transistors implement the logic function shown below in Table 1.

TABLE 1

Logical relationship between the Domino logic multiplexer inputs and output.

| INPUTS | | | |
| --- | --- | --- | --- |
| Te | Ti | D | OUTPUT |
| 0 | 0 | 0 | 0 |
| 0 | 0 | 1 | 0 |
| 0 | 1 | 0 | 1 |
| 0 | 1 | 1 | 1 |
| 1 | 0 | 0 | 0 |
| 1 | 0 | 1 | 1 |
| 1 | 1 | 0 | 0 |
| 1 | 0 | 1 | 1 |

As can be seen from Table 1, the output of the Domino logic multiplexer 32 at node 64 follows the input test data when the test enable signal (Te) is 0 and follows the data input signal (D) when the test enable signal is 1. Table 1 assumes that the two test enable input signals are mutually exclusive and, therefore, only one (Te) is shown.

The latch 34 is a prior art latch comprised of transmission gates and inverters as is known in the art. The latch 34 implements a D-type flip-flop wherein the output signal (Q) at output 66 follows the output of the multiplexer responsive to the system clock received on system clock input 68. The three inverters 70, 72 and 74 at the output (marked in dotted lines) are not necessary and can be removed if the added drive capability of these inverters is not essential. Similarly, if both polarities of the system clock are available inverters, 76 and 78 can also be removed. Further, the output 66 can be fanned out and directly observed as an additional primary output, if desired in the circuit. It should be apparent to those skilled in the art that other Domino scan flip-flops can be implemented using the principles and techniques described above. Examples include J-K flip-flops, T flip-flops, as well as others.

Figure 10:
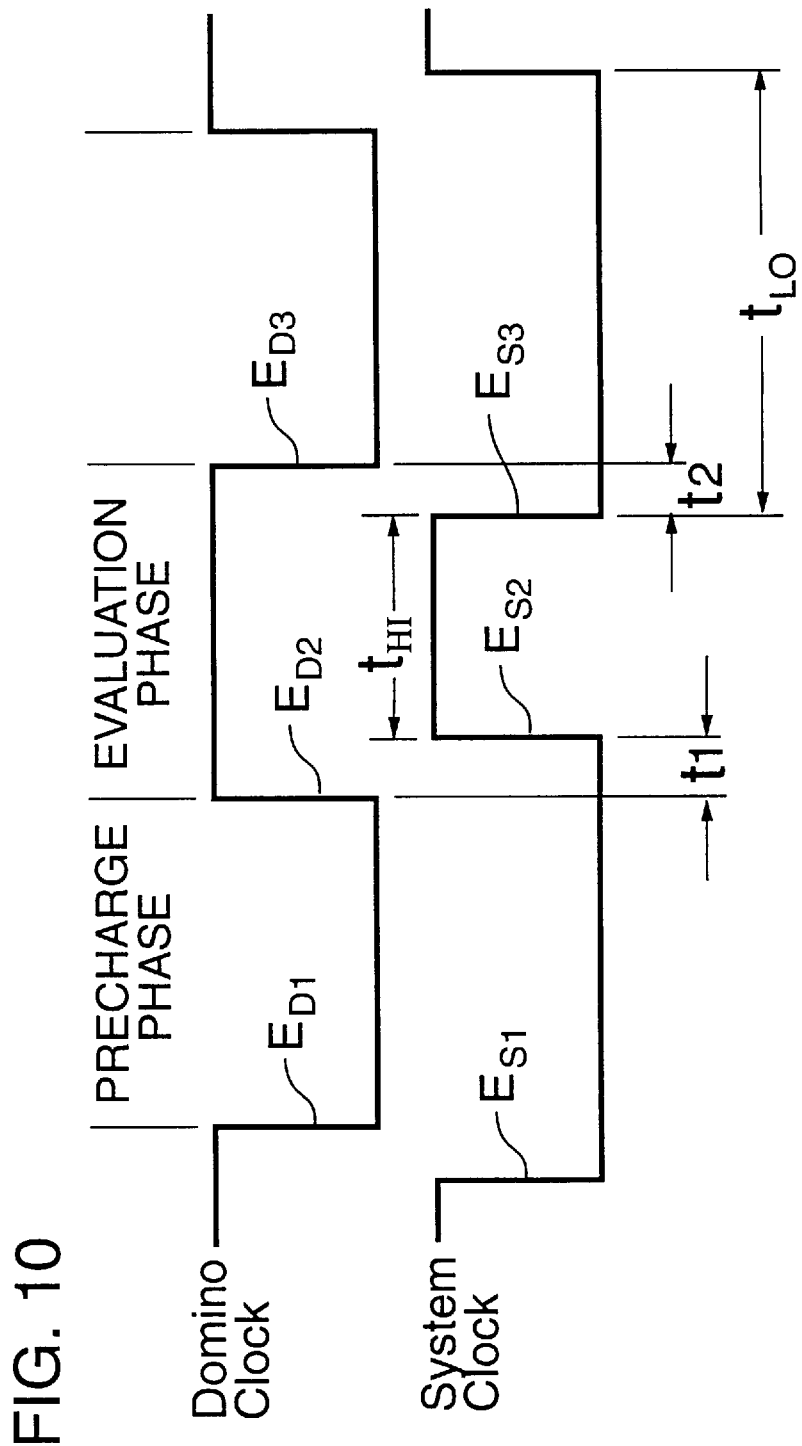
FIG. 10 is a diagram illustrating the relationship between the Domino clock and the system clock of the circuits shown in FIGS. 2–9.

Referring now to FIG. 10, the relationship between the Domino system clock is shown therein. As described above, the Domino clock forms two discrete phases: a precharge phase and an evaluation phase. In FIG. 10, the precharge phase for one period of the Domino clock begins at the trailing edge $E_{D1}$ and runs until a leading edge $E_{D2}$ during which time the Domino clock is at a logic 0. The evaluation phase begins at leading edge $E_{D2}$ and concludes at trailing edge $E_{D3}$. During the evaluation phase, as described above, the Domino clock is at a logic 1.

The system clock is used to latch the data produced during the evaluation phase into the latch. This latching occurs at a rising edge $E_{S2}$ goes until a falling edge $E_{S3}$ of the system clock. Thus, the leading edge $E_{S2}$ of the system clock is delayed by a time difference t1 relative to the leading edge $E_{D2}$ of the Domino clock to ensure that the output of the Domino logic (i.e., multiplexer 32) is at the proper logic level as determined by the Domino logic. Thus, the complex gate controlled by the Domino clock achieves evaluation phase before the latching circuit becomes active. In contrast, the trailing edge of the system clock $E_{S3}$ occurs before the trailing edge $E_{D3}$ of the Domino clock at a time period t2 to ensure that the output of the Domino logic is not latched during the precharge phase wherein the output would automatically go to 0 regardless of the state of the inputs. The minimum pulse width of the system clock is determined by the propagation delay of the circuit in which the flip-flop is included, as discussed further below.

Figure 3:
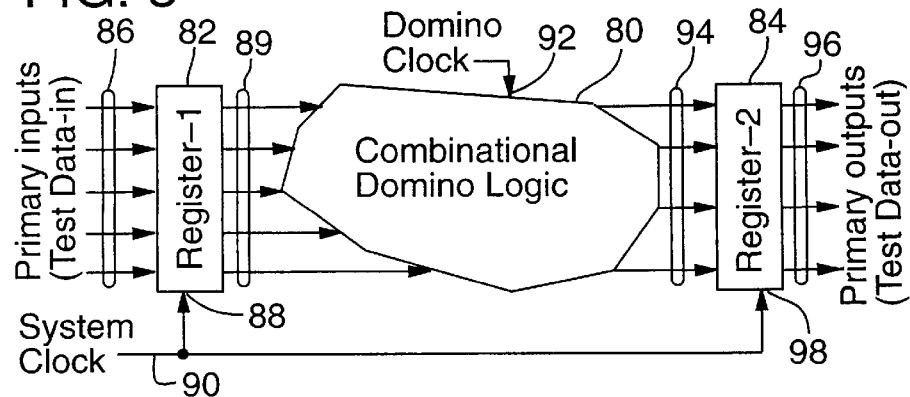
FIG. 3 is a block diagram of a first embodiment of a testable Domino logic circuit according to the invention.

A basic circuit configuration for testing Domino logic circuits according to the invention is shown in FIG. 3. This circuit includes a purely combinational Domino logic block 80 and two registers 82 and 84. This circuit is basic in that the Domino logic does not include any sequential elements. Domino logic circuits including sequential elements, however, are shown and discussed further below. The circuit includes a primary set of inputs 86 to which input test data is applied, also known as a test vector. Inputs 86 are coupled to a first register 82 to store this input test data. The register 82 includes a clock input 88 for receiving the system clock on clock line 90. The register 82 stores the input test data into the register responsive to the clock signal received at its clock input. The register 82 then provides this latched input test data to the combinational Domino logic block 80.

The Domino logic block 80 includes a clock input 92 for receiving the Domino clock. The Domino logic block 80 can implement any combinational logic function as is known in the art. The register 82 holds the value of the input test data at a constant level during the test mode. In normal mode of operation, register 82 behaves as a normal register and provides a buffering function to the Domino logic.

The circuit also includes a second register 84 coupled to a set of outputs 94 of the combinational Domino logic block 80. The data produced on outputs 94 are logically related to the data on inputs 89 according to the combinatorial logic function of block 80. The register 84 includes a clock input 98 coupled to the system clock line 90 for receiving the system clock. The register 84 stores the output data produced by the Domino logic block 80 to produce output test data on outputs 96 of the register 84. This output data can then be read and analyzed manually or by an IC tester or computer to detect faults within the Domino logic or in register 82 or register 84, or any interconnect wires. Without the register 84, the output test data would dissipate during the precharge phase. The registers above allow the test vectors to be pipelined thereby reducing test time.

The relationship between the Domino clock and the system clock is again shown in FIG. 10. Again, the leading edge of the system clock $E_{S2}$ is delayed relative to the leading edge of the Domino clock $E_{D2}$ by time t1 while the trailing edge $E_{S3}$ precedes the trailing edge $E_{D3}$ by another time delay t2. It should be noted that the time differences t1 and t2 can be sufficiently small. In an extreme case, t1 and t2 approach 0 and therefore the Domino clock becomes equivalent to the system clock. For testing, however, separate clocks are preferably used. The logic circuit also determines the minimum pulsewidth $t_{hi}$ of the system clock. In particular, $t_{hi}$ must be greater than the propagation delay from the output of register 82 to the input of register 84, plus the set up and hold time for register 84. In practice, an additional margin of error can be added to the pulsewidth to ensure that no set-up failures occur. This will ensure that the data is stable and at a valid logic state at the input to register 84 before the system clock transitions to logic 0. The minimum period that the system clock can be low, on the other hand (i.e., $t_{lo}$), is determined by the precharge time of the Domino logic circuit. The time $t_{lo}$ must be greater than the precharge time for the Domino logic to allow the Domino logic to adequately precharge before attempting to latch the data.

The circuit shown in FIG. 3 is tested in the following way. A test vector is fed or stored into register 82 when the system clock is 1. Any test vector can be fed into register 82 using the primary inputs 86. After the system clock transitions to 0, the Domino logic is initialized by setting the Domino clock to 0, i.e., the precharge phase. The Domino clock then transitions to 1, which begins the evaluation phase of the Domino logic. During this time, the test vector is applied to the Domino logic and the response is stored into register 84. The contents of register 84 can then be sampled to determine whether there is a fault within the Domino logic block 80, register 82, register 84 or any interconnect. This sequence is then repeated until all of the test vectors are applied.

Figure 4:
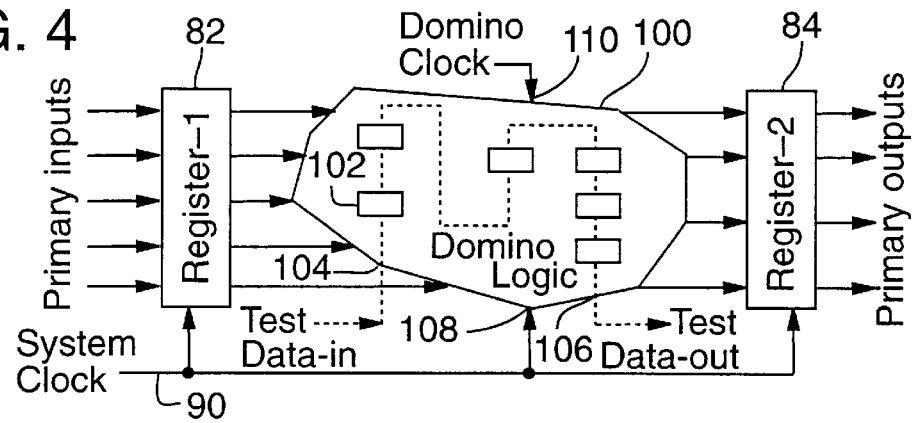
FIG. 4 is a block diagram of a second embodiment of the invention wherein the Domino logic includes one or more Domino scan flip-flops according to the invention.

Another embodiment of the invention is shown in FIG. 4. In this embodiment, the Domino logic block 100 includes one or more sequential elements such as flip-flop 102. In the preferred embodiment, these sequential elements are Domino scan flip-flops such as shown in FIG. 2. These scan flip-flops are then connected in a serial scan chain such as shown in FIG. 4 wherein the test data input (Ti) of one scan flip-flop is connected to the output (Q) of the preceding scan flip-flop in the chain to form a continuous serial scan chain. The Domino logic block 100 also includes a test enable input (not shown) for receiving the test enable signal, which is connected to the test enable inputs (Te) of each flip-flop, a scan data input 104 for receiving a scan input data signal, a scan output 106 for providing a scan output signal, a system clock input 108 for receiving the system clock, and a Domino clock input 110 for receiving the Domino clock signal. These signals are then connected up to the individual Domino scan flip-flops as shown in FIG. 2 and as described above to form the serial scan chain.

The circuit structure shown in FIG. 4 requires a different mechanism for loading or storing the test vector into the circuit as compared to that required by the circuit in FIG. 3. In the circuit of FIG. 4, in addition to the input test data being latched into input register 84, additional test data is serially fed into the sequential elements in the Domino logic block 100 by asserting the test enable signal and toggling the Domino and system clocks. The number of cycles required to feed the input data into the scan flip-flops is determined by the number of cycles required to initialize the Domino logic block 100 to a known state. Once the sequential elements are initialized, the response can be stored into register 84, which can then be read by an external device such as a tester. In addition, the contents of the scan chain can be taken out of the scan flip-flops in a similar manner which they are fed in. Taking out of the test data, however, can be overlapped with feeding in the test data for the next vector.

Figure 5:
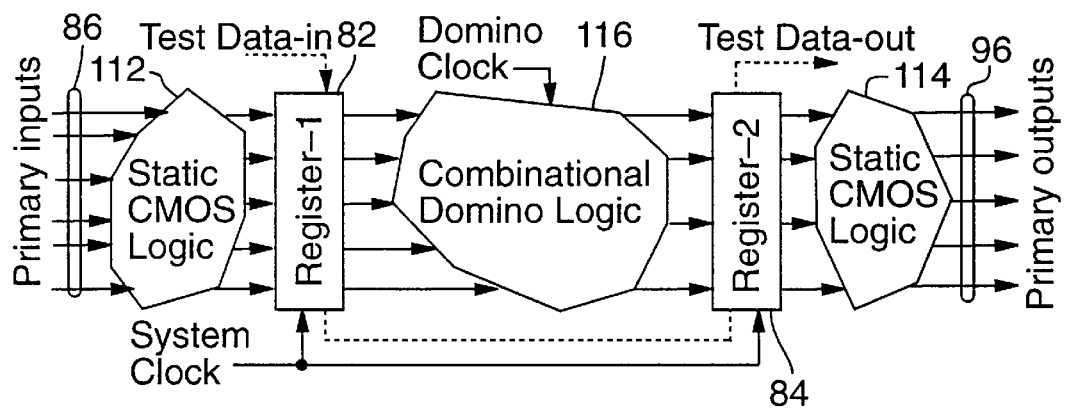
FIG. 5 is a block diagram of a third embodiment of the invention which includes static CMOS logic at both the input and output of the circuit.

Another circuit embodiment is shown in FIG. 5. This embodiment includes static CMOS logic 112 interposed between the primary inputs 86 and the register 82 as well as a static CMOS logic block 114 interposed between the output of register 84 and the primary outputs 96. Thus, registers 82 and 84 and the Domino logic block are embedded in combinational static CMOS logic. In order to initialize these registers to known values, the storage elements in registers 82 and 84' are replaced by scan flip-flops that are connected in a serially scan chain with the scan output of register 82 connected to a scan input of register 84. The combinational Domino logic block 116 is then tested by scanning an input test vector into register 82, performing an evaluation phase, latching the resulting output data in register 84, and shifting that output data out of register 84 using the scan chain.

The static CMOS logic 112, on the other hand, can be tested by applying a test vector to inputs 86, latching the resulting data in register 82, and scanning the resulting data out using the scan chain formed by registers 82 and 84. The static CMOS logic block 114, on the other hand, is tested by scanning an input test vector into register 84 and then observing the resulting output data on the primary outputs 96. In this way, all of the logic, both static and combinational, can be tested. Some or all of these tests can be overlapped.

Figure 6:
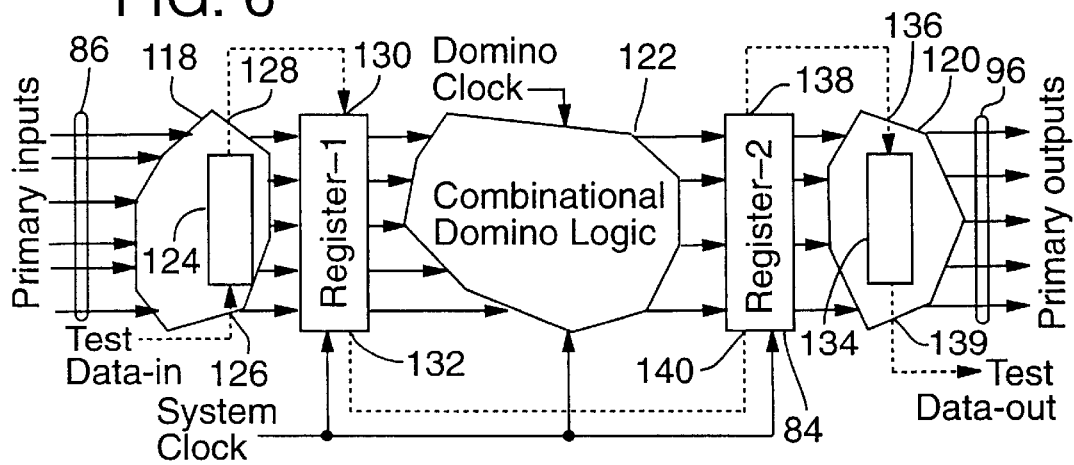
FIG. 6 is a block diagram of a fourth embodiment of the invention wherein the static CMOS logic includes one or more scan-type flip-flops.

A variation of the circuit shown in FIG. 5 is shown in FIG. 6. This circuit also includes a static CMOS logic block 118 at the input and a static CMOS logic block 120 at the output. In this case, however, both logic blocks include sequential elements. Logic block 118 includes one or more sequential elements 124 that are connected in a serial scan chain. In the preferred embodiment, these scan elements are static CMOS scan flip-flops connected in the conventional manner. The static logic block 118 includes a test data input 126 for receiving an input test data signal and a test data output 128 for providing an output test data signal. The test output 128 is connected to a test input 130 of the register 82 so as to connect the sequential elements 124 in the static CMOS logic block 118 in series with the sequential scan elements in register 82.

The static CMOS logic block 120 also includes one or more sequential elements 134 arranged as a serially scan chain. These sequential elements are also implemented in the preferred embodiment with static CMOS scan flip-flops. The scan chain formed within static CMOS logic block 120 is connected in series with the scan chain formed by register 84. Registers 82 and 84 can then be connected together to form a single continuous scan chain that includes the sequential elements 124 in block 118, the sequential elements in register 82, the sequential elements in register 84, and the sequential elements 134 in block 120. This continuous scan chain allows both the static CMOS logic blocks 118 and 120 to be tested as well as the combinational Domino logic block 122. Alternatively, the sequential elements 124 and 82 can be connected into a separate scan chain from that formed by registers 84 and 134. In another alternative, the sequential elements 124 and 134 can be connected into a separate scan chain from that formed by registers 82 and 84.

The testing of the combinational Domino logic block 122 is conducted in the same manner as that described above with reference to FIG. 5. The static CMOS logic blocks 118 and 120, however, are tested differently in that test data must be scanned into the sequential elements in order to initialize the state of the static CMOS logic. Otherwise, the testing is similar to that shown and described above in FIG. 5.

It should be noted that the circuit in FIG. 6 can represent a situation where the majority of the design is static CMOS and only a few selected blocks such as a parallel multiplier/divider, datapath logic, or ALU, are implemented in Domino logic. In that case, all of the flip-flops in the static CMOS logic can be replaced with a static scan flip-flops as shown in FIG. 6.

Figure 7:
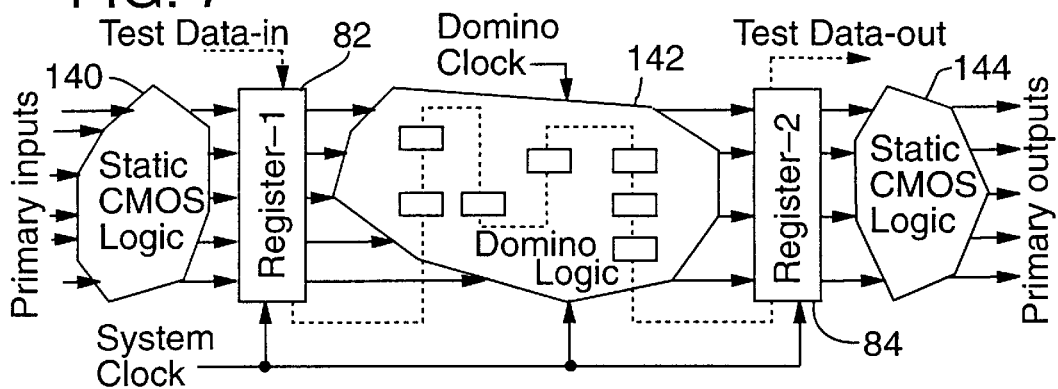
FIG. 7 is a block diagram of a fifth embodiment of the invention wherein the Domino logic includes one or more Domino scan flip-flops.

FIG. 7 shows another circuit configuration in which sequential Domino logic is embedded in combinational static CMOS logic. In effect, the circuit shown in FIG. 7 is a combination of the circuit shown in FIGS. 4 and 5. The circuit includes static CMOS logic block 140 at the input and static CMOS logic block 144 at the output. In addition, Domino logic block 142 includes one or more Domino scan flip-flops connected in a serial scan chain such as shown in FIG. 4. The serial scan chain of Domino logic block 142 is integrated into the scan chain formed by registers 82 and 84 to form a single scan chain including all of the sequential elements in the circuit. It is not essential that the elements be connected in the exact order shown in FIG. 7, all that is important is that each of the elements are in a scan chain that can be loaded. In addition, the Domino scan flip-flops in Domino logic block 142 can be connected into a separate scan chain from the scan flip-flops in registers 82 and 84. A single scan chain, however, is preferable for testing. The invention, however, is not limited thereto.

In the circuit of FIG. 7, it can be assumed that the circuit contains two combinational Domino logic blocks separated by a shift register formed by the Domino scan flip-flops. Accordingly, it can be tested as two cascaded blocks circuits shown in FIG. 5.

Figure 8:
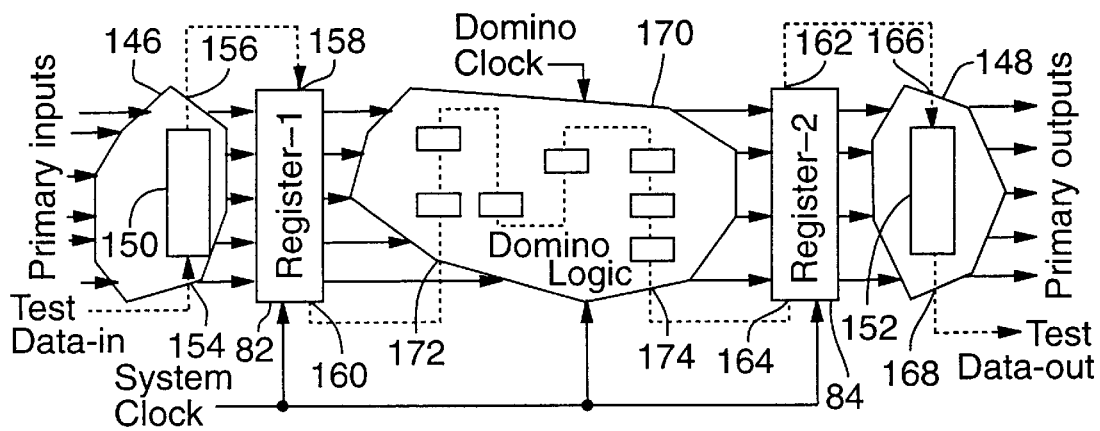
FIG. 8 is a block diagram of a sixth embodiment of the invention wherein both the static CMOS logic and the Domino logic include scan flip-flops integrated into a single scan chain.

Another hybrid configuration according to the invention is shown in FIG. 8. As with the circuit in FIG. 6, it contains two static CMOS logic blocks 146 and 148, each of which includes a scan chain 150 and 152, respectively. In the preferred embodiment, these scan chains 150 and 152 are comprised of static CMOS scan flip-flops arranged in a conventional manner. The input static CMOS logic block 146 includes a test data input 154 for receiving a test input data signal and a test data output 156 for providing a test output data signal. The test output 156 is connected to a test input 158 of register 82 so as to connect the scan chain 150 with the scan chain of register 82 to form a single scan chain. This is the same arrangement shown and described above with reference to FIG. 6. Similarly, the static CMOS logic block 148 includes a test input 166 and a test output 168. The test input 166 is connected to a test output 162 of register 84 so as to connect the scan chains formed by register 84 and the sequential elements within logic block 148. The test output 168 provides a test output signal to an external device such as a tester or computer to allow the contents of the static and Domino sequential elements to be taken out for observation during the test mode.

Figure 9:
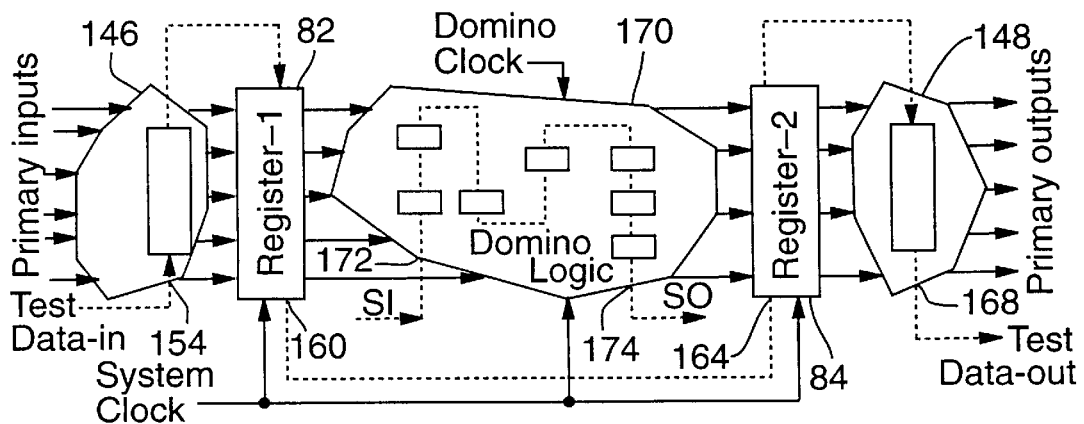
FIG. 9 is a block diagram of a seventh embodiment of the invention wherein the Domino logic and the static CMOS logic include one or more scanned flip-flops, each forming a separate scan chain.

Unlike FIG. 6, Domino logic block 170 includes one or more Domino scan flip-flops as shown above in FIG. 2. These scan flip-flops are themselves connected in a serial scan chain as shown in FIG. 8. Domino logic block 170 includes a test data input 172 that is connected to a test output 160 of register 82. The test data input 164 of register 84 is connected to a test data output 174 of Domino logic block 170. In this way, all of the sequential elements in the circuit, both static and dynamic, are connected in a single serial scan chain. Alternatively, the Domino scan flip-flops can be connected on a separate Domino scan chain and the static scan flip-flops connected in a separate static scan chain is shown in FIG. 9. As shown therein, the test input 172 of the Domino logic block 170 receives a separate input test data signal (SI) and provides a separate test data output signal (SO) from that of the static scan chain comprised of sequential elements in static CMOS logic block 146 and 148 and registers 82 and 84. The circuits in FIG. 8 or 9 represent the general circuit configurations in future technologies.

The circuit configuration shown in FIG. 8 can be tested by treating the circuit as two Domino logic blocks separated by a shift register formed by the Domino scan flip-flops. Thus, the testing becomes equivalent to testing two cascaded blocks like those shown in FIG. 6. In order to test the Domino logic the following sequence is followed. A test vector is fed into register 82 and into the Domino scan flip-flops within the Domino logic block. This is accomplished by using multiple clock periods. Once these sequential elements have been initialized, the Domino clock is set to 0 to initialize the Domino logic. Next, the Domino clock is set to 1, thereby initiating the evaluation phase. After a time t1 (FIG. 10), the system clock transitions from 0-to-1 to apply the test vector to the Domino logic. The response is then stored in both the Domino scan flip-flops in Domino logic block 170 and the static scan flip-flops in register 84. The test results are then fed out of the scan flip-flops through the single scan chain of FIG. 8 or out of the separate scan chains of FIG. 9.

A circuit architecture for testing Domino logic has been described herein. That architecture, at its essence, includes one register before the Domino logic in order to hold an input test vector and one register downstream of the Domino logic to hold the results of the test vector application. This basic architecture has been extended herein to cover so-called hybrid circuits including both Domino logic and static logic by the use of scan flip-flops in these two registers as well as in place of the sequential elements in the static logic. In another aspect of the invention, a Domino scan flip-flop has been described to allow sequential Domino logic to be tested using this same test architecture. It will be apparent to those skilled in the art that different hybrid circuit configurations can be implemented other than those shown and described above. For example, hybrid circuit configurations including either an input static CMOS logic block or an output static CMOS logic block, but not both, or more than one Domino logic block, or multiple static CMOS blocks and multiple Domino logic blocks, can be implemented using the principles and techniques described above, which permit the whole circuit to be tested using the methods described above. Moreover, the invention is not limited to the D-type Domino scan flip-flops shown and described above. Other logical flip-flops can be implemented such as J-K or T flip-flops as long as they satisfy the criteria as described above.

Having described and illustrated the principles of the invention in a preferred embodiment thereof, it should be apparent that the invention can be modified in arrangement and detail without departing from such principles. I claim all modifications and variation coming within the spirit and scope of the following claims.

I claim:

1. A testable logic circuit comprising:
   a first register having a first set of inputs for receiving the test input data, a clock input for receiving a first clock signal, and a first set of outputs for providing a latched version of the primary test input data;
   a domino logic block including a plurality of domino logic elements coupled together to implement a logic function, the domino logic block having a set of inputs coupled to the first set of outputs for receiving the latched version of the primary test input data, a domino clock input for receiving a domino clock, and a set of outputs for providing a set of domino output data; and
   a second register having a second set of inputs coupled to the set of outputs of the domino logic block, a clock input for receiving a second clock signal, and a second set of outputs for providing a latched version of the domino output data;
   the domino logic block including:
     a domino test data input for receiving a domino scan data input signal;

a domino test enable input for receiving a domino scan test enable signal;

a domino test data output for providing a domino scan data output signal;

a plurality of domino scan flip-flops, each of the domino scan flip-flops including a data input, a data output, a clock input for receiving a clock signal, a test data input, a test enable input coupled to the domino test enable input of the domino logic block, a domino clock input coupled to the domino clock input of the domino logic block, the domino scan flip-flops arranged in a serial scan chain from a first domino scan flip-flop whose data input is coupled to the domino test data input of the domino logic block, to a last domino scan flip-flop whose data output is coupled to the domino test data output of the domino logic block, each domino flip-flop between the first and last domino scan flip-flops having its respective test data input coupled to the data output of a preceding domino scan flip-flop in the chain.

2. A testable logic circuit according to claim 1 further comprising:

a primary set of inputs for receiving the test input data;

a first static logic block having a first set of inputs coupled to the primary set of inputs and having a first set of outputs coupled to the first set of inputs of the first register;

a primary set of outputs; and a second static logic block having a second set of inputs coupled to the second set of outputs of the second register and having a second set of outputs coupled to the primary set of outputs of the logic circuit for providing the test output data.

3. A testable logic circuit according to claim 2 wherein the first register includes:

a first test data input for receiving a first static scan data input signal;

a first test data output for providing a first static scan data output signal;

a test enable input for receiving a test enable signal; and a plurality of static scan flip-flops, each static scan flip-flop including a data input, a data output, a clock input for receiving the first clock signal, a test data input, and a test enable input coupled to the test enable input of the first register, the static flip-flops arranged in a serial scan chain from a first static scan flip-flop whose data input is coupled to the first test data input of the first register, to a last static scan flip-flop whose data output is coupled to the first test data output of the first register, each static scan flip-flop between the first and last static scan flip-flops having its respective test data input coupled to the data output of a preceding static scan flip-flop in the chain.

4. A testable logic circuit according to claim 3 wherein the second register includes:

a second test data input coupled to the first test data output;

a second test data output for providing a second static scan data output signal;

a test enable input for receiving the test enable signal; and a plurality of static scan flip-flops, each static scan flip-flop including a data input, a data output, a clock input for receiving the first clock signal, a test data input, and a test enable input coupled to the test enable input of the first register, the static flip-flops arranged in a serial scan chain from a first static scan flip-flop whose data input is coupled to the second test data input of the second register, to a last static scan flip-flop whose data output is coupled to the second test data output of the second register, each static scan flip-flop between the first and last static scan flip-flops having its respective test data input coupled to the data output of a preceding static scan flip-flop in the chain.

5. A testable logic circuit according to claim 4 wherein the first test data output is connected to the domino test data input and the domino test data output is connected to the second test data input so as to form a combined scan chain including the static scan flip-flops in the first and second registers and the domino flip-flops of the domino logic block.

6. A testable logic circuit according to claim 5 wherein the first static logic block includes:

a third test data input for receiving the test data input signal;

a third test data output connected to the first test data input of the first register;

a test enable input for receiving the test enable signal; and a plurality of static scan flip-flops, each static scan flip-flop including a data input, a data output, a clock input for receiving the first clock signal, a test data input, and a test enable input coupled to the test enable input of the first static logic block, the static flip-flops arranged in a serial scan chain from a first static scan flip-flop whose data input is coupled to the third test data input of the first static logic block, to a last static scan flip-flop whose data output is coupled to the first test data input of the first register, each static scan flip-flop between the first and last static scan flip-flops having its respective test data input coupled to the data output of a preceding static scan flip-flop in the chain.

7. A testable logic circuit according to claim 5 wherein the second static logic block includes:

a third test data input connected to the second test data output of the second register;

a third test data output for providing the test data output signal;

a test enable input for receiving the test enable signal; and a plurality of static scan flip-flops, each static scan flip-flop including a data input, a data output, a clock input for receiving the first clock signal, a test data input, and a test enable input coupled to the test enable input of the second static logic block, the static flip-flops arranged in a serial scan chain from a first static scan flip-flop whose data input is connected to the second test data output of the second register, to a last static scan flip-flop whose data output is connected to the third test data output of the second static logic block, each static scan flip-flop between the first and last static scan flip-flops having its respective test data input coupled to the data output of a preceding static scan flip-flop in the chain.

8. A testable logic circuit according to claim 1 wherein the domino scan flip-flop is a D-type domino scan flip-flop.

9. A testable logic circuit according to claim 1 wherein the each domino scan flip-flop includes:

a latch having a data input, a clock input coupled to the clock input of the domino scan flip-flop, and a data output coupled to the data output of the domino scan flip-flop; and a domino logic multiplexer having a domino clock input coupled to the domino clock input of the domino scan flip-flop, a data input coupled to the data input of the domino scan flip-flop for receiving an input data signal, a first test enable input for receiving a first test enable signal, a second test enable input for receiving a second test enable signal, a test data input coupled to the test data input of the domino scan flip-flop for receiving a test input data signal, and a data output coupled to the data input of the latch for providing the input data signal to the latch if the first test enable signal is asserted and the test input data signal if the second test enable signal is asserted.

10. A testable logic circuit comprising:

a static input logic block having a set of inputs for receiving primary test data signals and a set of outputs;

a first register having a first set of inputs coupled to the set of outputs of the static input logic block for receiving input data, a clock input for receiving a first clock signal, and a first set of outputs for providing a latched version of the input data;

a domino logic block including a plurality of domino logic elements coupled together to implement a logic function, the domino logic block having a set of inputs coupled to the first set of outputs for receiving the latched version of the input data, a domino clock input for receiving a domino clock, and a set of outputs for providing a set of domino output data; and a second register having a second set of inputs coupled to the set of outputs of the domino logic block, a clock input for receiving a second clock signal, and a second set of outputs for providing a latched version of the domino output data;

the domino logic block including a plurality of domino scan flip-flops connected together in a serial scan chain.

11. A testable logic circuit comprising:

a static input logic block having a set of inputs for receiving primary test data signals and a set of outputs;

a first register having a first set of inputs coupled to the set of outputs of the static input logic block for receiving input data, a clock input for receiving a first clock signal, and a first set of outputs for providing a latched version of the input data;

a domino logic block including a plurality of domino logic elements coupled together to implement a logic function, the domino logic block having a set of inputs coupled to the first set of outputs for receiving the latched version of the input data, a domino clock input for receiving a domino clock, and a set of outputs for providing a set of domino output data; and a second register having a second set of inputs coupled to the set of outputs of the domino logic block, a clock input for receiving a second clock signal, and a second set of outputs for providing a latched version of the domino output data;

the first register including:

a first register test data input for receiving a first scan data input signal;

a first register test data output for providing a first scan data output signal;

a test enable input for receiving a test enable signal; and a plurality of scan flip-flops, each scan flip-flop including a data input, a data output, a clock input for receiving the first clock signal, a test data input, and a test enable input coupled to the first register test enable input, the flip-flops arranged in a serial scan chain from a first scan flip-flop whose data input is coupled to the first register test data input, to a last static scan flip-flop whose data output is coupled to the first register test data output, each static scan flip-flop between the first and last static scan flip-flops having its respective test data input coupled to the data output of a preceding static scan flip-flop in the chain; and each scan flip-flop including a domino clock input for receiving the domino clock.

12. A testable logic circuit according to claim 11 wherein the static input logic block includes:

a first logic block test data input for receiving a first logic block scan test data input signal;

a first logic block test data output connected to the first register test data input;

a clock input for receiving the first clock signal;

a test enable input for receiving the test enable signal; and a plurality of scan flip-flops, each scan flip-flop including a data input, a data output, a clock input coupled to the clock input of the static input logic block, a test data input, and a test enable input coupled to the test enable input of the static input logic block, the scan flip-flops arranged in a serial scan chain from a first scan flip-flop whose data input is connected to the first logic block test data input to a last scan flip-flop whose data output is connected to the first register test data input, each scan flip-flop between the first and last scan flip-flops having its respective test data input coupled to the data output of a preceding scan flip-flop in the chain.

13. A testable logic circuit according to claim 12 wherein each scan flip-flop includes static logic.

14. A testable logic circuit according to claim 11 wherein the second register includes:

a second register test data input connected to the first register test data output;

a second register test data output for providing a second scan data output signal;

a test enable input for receiving the test enable signal; and a plurality of scan flip-flops, each scan flip-flop including a data input, a data output, a clock input for receiving the first clock signal, a test data input, and a test enable input coupled to the second register test enable input, the flip-flops arranged in a serial scan chain from a first scan flip-flop whose data input is connected to the first register test data output, to a last static scan flip-flop whose data output is coupled to the second register test data output, each static scan flip-flop between the first and last static scan flip-flops having its respective test data input coupled to the data output of a preceding static scan flip-flop in the chain.

15. A testable logic circuit according to claim 14 further including a static output logic block having a set of inputs coupled to the second set of outputs of the second register and a set outputs for providing primary test data output signals.

16. A testable logic circuit according to claim 15 wherein the static output logic block includes:

a second logic block test data input connected to the second register test data output;

a second logic block test data output for providing a second logic block test data output signal;

a clock input for receiving the first clock signal;

a test enable input for receiving the test enable signal; and a plurality of scan flip-flops, each scan flip-flop including a data input, a data output, a clock input coupled to the clock input of the static output logic block, a test data input, and a test enable input coupled to the test enable input of the static output logic block, the scan flip-flops arranged in a serial scan chain from a first scan flip-flop whose data input is connected to the second register test data output to a last scan flip-flop whose data output is connected to the second logic block test data output, each scan flip-flop between the first and last scan flip-flops having its respective test data input coupled to the data output of a preceding scan flip-flop in the chain.

17. A testable logic circuit comprising:

a static input logic block having a set of inputs for receiving primary test data signals and a set of outputs;

a first register having a first set of inputs coupled to the set of outputs of the static input logic block for receiving input data, a clock input for receiving a first clock signal, and a first set of outputs for providing a latched version of the input data;

a domino logic block including a plurality of domino logic elements coupled together to implement a logic function, the domino logic block having a set of inputs coupled to the first set of outputs for receiving the latched version of the input data, a domino clock input for receiving a domino clock, and a set of outputs for providing a set of domino output data; and a second register having a second set of inputs coupled to the set of outputs of the domino logic block, a clock input for receiving a second clock signal, and a second set of outputs for providing a latched version of the domino output data;

the domino logic block including:

a domino test data input for receiving a domino scan data input signal;

a domino test enable input for receiving a domino scan test enable signal;

a domino test data output for providing a domino scan data output signal;

a plurality of domino scan flip-flops, each of the domino scan flip-flops including a data input, a data output, a clock input for receiving a clock signal, a test data input, a test enable input coupled to the domino test enable input of the domino logic block, a domino clock input coupled to the domino clock input of the domino logic block, the domino scan flip-flops arranged in a serial scan chain from a first domino scan flip-flop whose data input is coupled to the domino test data input of the domino logic block, to a last domino scan flip-flop whose data output is coupled to the domino test data output of the domino logic block, each domino flip-flop between the first and last domino scan flip-flops having its respective test data input coupled to the data output of a preceding domino scan flip-flop in the chain.

18. A testable logic circuit according to claim 17 wherein the each domino scan flip-flop includes:

a latch having a data input, a clock input coupled to the clock input of the domino scan flip-flop, and a data output coupled to the data output of the domino scan flip-flop; and a domino logic multiplexer having a domino clock input coupled to the domino clock input of the domino scan flip-flop, a data input coupled to the data input of the domino scan flip-flop for receiving an input data signal, a first test enable input for receiving a first test enable signal, a second test enable input for receiving a second test enable signal, a test data input coupled to the test data input of the domino scan flip-flop for receiving a test input data signal, and a data output coupled to the data input of the latch for providing the input data signal to the latch if the first test enable signal is asserted and the test input data signal if the second test enable signal is asserted.

19. A testable logic circuit comprising:

a domino logic block including a plurality of domino logic elements coupled together to implement a logic function;

means for storing an input test vector coupled to the domino logic block to provide the test vector thereto; and means for storing an output test result;

the domino logic block including a plurality of domino scan flip-flops connected together in a serial scan chain.

20. A testable logic circuit according to claim 19 wherein the means for storing an input test vector includes a register.

21. A testable logic circuit according to claim 19 further comprising an input static CMOS logic block coupled to the means for storing the input test vector.

22. A testable logic circuit according to claim 21 wherein the means for storing an input test vector includes a register includes a plurality of scan flip-flops connected together in a serial scan chain.

23. A testable logic circuit according to claim 19 wherein the means for storing an output test result includes a register.

24. A testable logic circuit according to claim 23 wherein the register includes a plurality of scan flip-flops connected in a serial scan chain.

* * * * *